United States Patent
Rhie

(10) Patent No.: US 7,692,950 B2
(45) Date of Patent: Apr. 6, 2010

(54) SEMICONDUCTOR MEMORY DEVICE

(75) Inventor: Hyoung-Seub Rhie, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 67 days.

(21) Appl. No.: 11/969,972

(22) Filed: Jan. 7, 2008

(65) Prior Publication Data

US 2008/0165567 A1 Jul. 10, 2008

(30) Foreign Application Priority Data

Jan. 8, 2007 (KR) .................. 10-2007-0002145

(51) Int. Cl.
*G11C 11/00* (2006.01)

(52) U.S. Cl. .................. 365/148; 365/63; 365/158

(58) Field of Classification Search ................. 365/148, 365/63, 158

See application file for complete search history.

(56) References Cited

U.S. PATENT DOCUMENTS

| | | | |
|---|---|---|---|
| 6,801,448 B2 | 10/2004 | Hsu | |
| 6,985,376 B2 * | 1/2006 | Matsuoka | 365/148 |
| 7,016,222 B2 * | 3/2006 | Morikawa | 365/158 |
| 7,057,922 B2 * | 6/2006 | Fukumoto | 365/158 |
| 7,423,898 B2 * | 9/2008 | Tanizaki et al. | 365/148 |
| 7,511,985 B2 * | 3/2009 | Horii et al. | 365/148 |
| 7,535,756 B2 * | 5/2009 | Lung | 365/163 |
| 7,542,326 B2 * | 6/2009 | Yoshimura et al. | 365/148 |
| 2004/0130939 A1 | 7/2004 | Morikawa | |
| 2005/0122768 A1 | 6/2005 | Fukumoto | |

FOREIGN PATENT DOCUMENTS

JP 2006099866 4/2006

\* cited by examiner

*Primary Examiner*—Viet Q Nguyen
(74) *Attorney, Agent, or Firm*—Volentine & Whitt, PLLC

(57) ABSTRACT

There is provided a semiconductor memory device including; first and second active areas formed to extend in a first direction on a semiconductor substrate, first and second split word lines formed in a second direction on the semiconductor substrate, a common source line extending between the first and second active areas in the first direction and coupled to the first and second active areas, a first variable resistance element formed on the first active area between the first and second split word lines, a second variable resistance element formed on the second active area between the first and second split word lines, first and second bit lines extending in the first direction and respectively coupled to the first and second variable resistance elements.

18 Claims, 9 Drawing Sheets

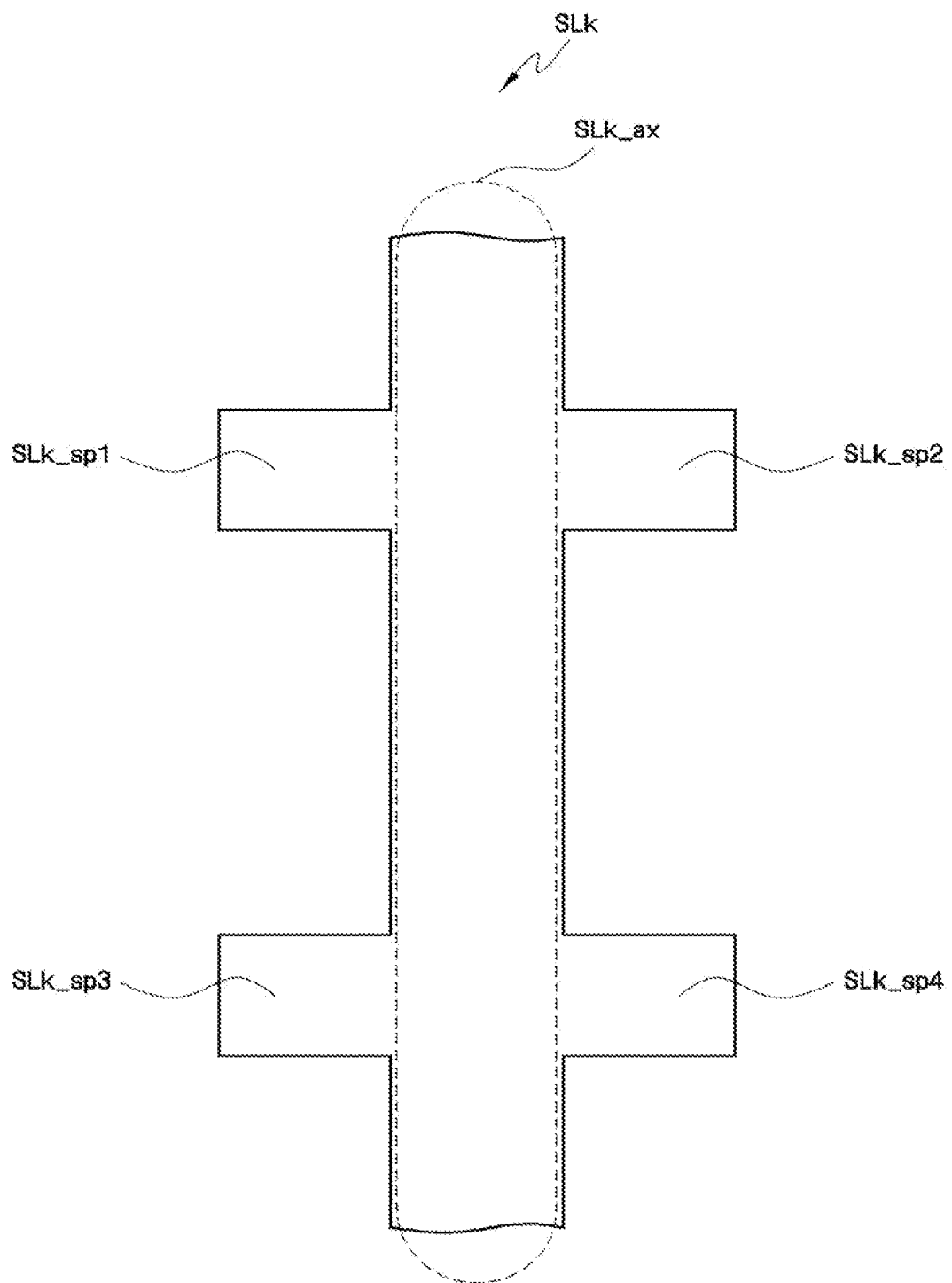

SEMICONDUCTOR MEMORY DEVICE

CROSS REFERENCE TO RELATED APPLICATION

This application claims priority to Korean Patent Application No. 10-2007-0002145 filed on Jan. 8, 2007, the subject matter of which is hereby incorporated by reference.

BACKGROUND OF THE INVENTION

1. Field of the Invention

The present invention relates to a semiconductor memory device. More particularly, the invention relates to a semiconductor memory device having resistive elements providing improving memory cell density.

2. Description of the Related Art

Resistive Random Access Memory (hereinafter, 'RRAM') stores data by varying the resistance of a resistive element. Data may be written to a selected memory cell in an RRAM by applying a predetermined current to the corresponding resistive element. The amount of applied current may be controlled by defining a voltage potential difference between a bit line and a source line associated with the selected memory cell. RRAM generally includes types of RRAM in which different data values may be written in accordance with the polarity (i.e., the directional flow) of the applied current through the resistive element. Such devices are sometimes referred to as a "bipolar RRAM." In the case of a bipolar RRAM, a bit line and source line are required for each memory cell in order to write different data values to the bipolar RRAM. As a result of this requirement, the size of a memory cell array becomes large.

SUMMARY OF THE INVENTION

Embodiments of the invention provides a RRAM having improved cell density.

In one embodiment, the invention provides a semiconductor memory device comprising; first and second active areas extending in a first direction on a semiconductor substrate, first and second split word lines extending in a second direction on the semiconductor substrate, a common source line extending between the first and second active areas in the first direction and coupled to the first and second active areas, a first variable resistance element formed on the first active area between the first and second split word lines, a second variable resistance element formed on the second active area between the first and second split word lines, and first and second bit lines extending in the first direction, and respectively coupled to the first and second variable resistance elements.

In another embodiment, the invention provides a semiconductor memory device comprising; first and second split word lines formed on a semiconductor substrate, a common source line having a fishbone antenna-like shape and including an axis source line intersecting the first and second split word lines and a plurality of spine source lines protruding from the axis source line, and first and second bit lines intersecting the first and second split word lines.

In another embodiment, the invention provides a semiconductor memory device comprising; a first memory cell comprising first and second access elements and a first variable resistance element coupled between the first and second access elements, a second memory cell comprising third and fourth access elements and a second variable resistance element coupled between the third and fourth access elements, a first bit line coupled to the first variable resistance element and a second bit line coupled to the second variable resistance element, a first split word line coupled to the first and third access elements and a second split word line coupled to the second and fourth access elements, and a common source line coupled to the first, second, third and fourth access elements.

BRIEF DESCRIPTION OF THE DRAWINGS

FIG. 3B is a diagram illustrating the layout of the common source line (SLk) shown in FIG. 3A;

DESCRIPTION OF EMBODIMENTS

Figure 1:
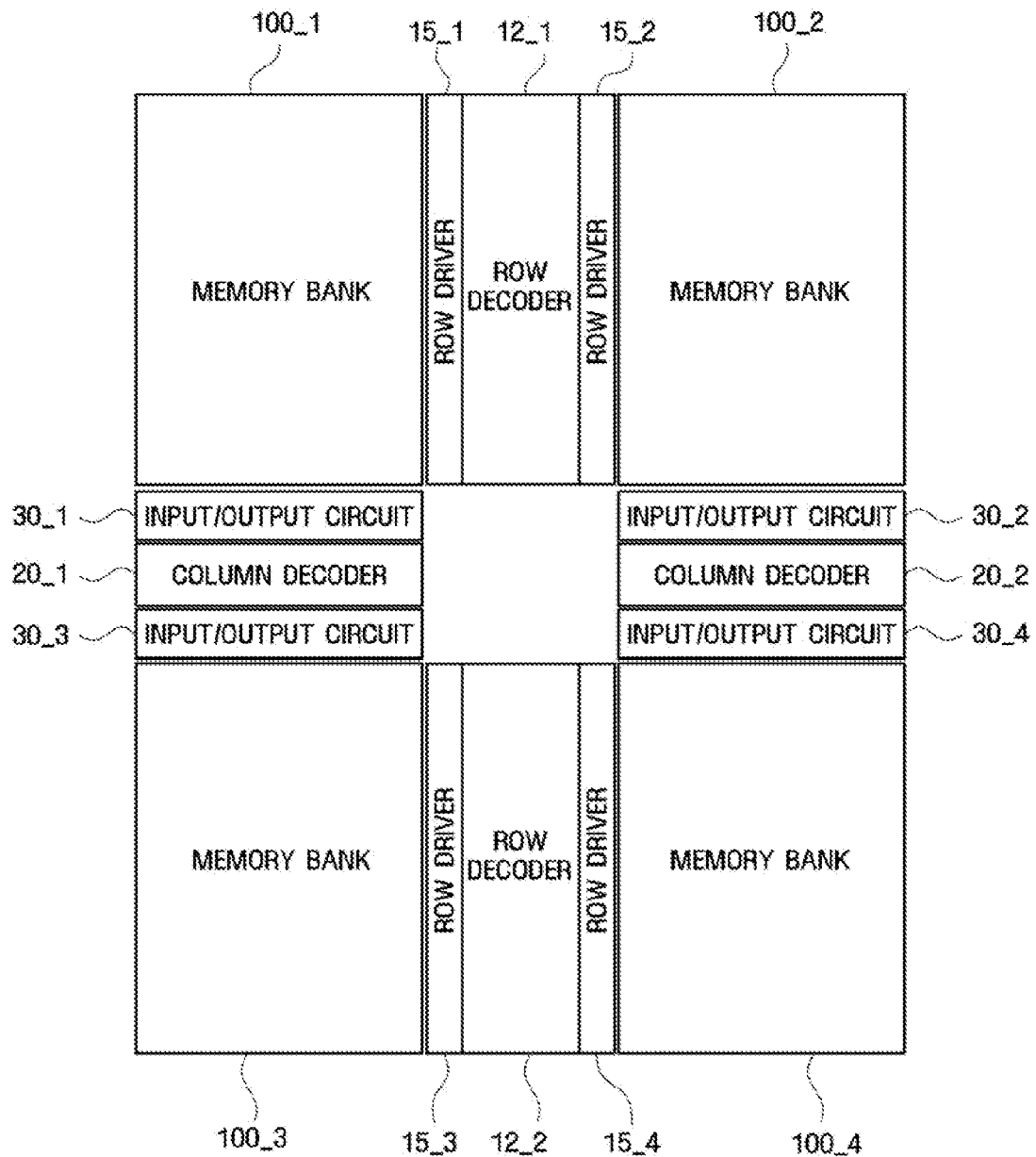
FIG. 1 is a block diagram illustrating a semiconductor memory device according to an embodiment of the invention.

Advantages and features of the present invention and methods of accomplishing the same may be understood more readily by reference to the following detailed description of preferred embodiments and the accompanying drawings. The present invention may, however, be embodied in many different forms and should not be construed as being limited to only the illustrated embodiments. Rather, these embodiments are provided so that this disclosure will be thorough and complete and will fully convey the concept of the invention to those skilled in the art, and the present invention will only be defined by the appended claims. In the embodiments of the present invention, detailed description of known device structures and techniques incorporated herein will be omitted when it may make the subject matter of the present invention unclear. Like reference numerals refer to like elements throughout the specification.

It will be understood that when an element or layer is referred to as being "on", "connected to" or "coupled with" another element or layer, it can be directly on, connected or coupled with the other element or layer or intervening elements or layers may be present. In contrast, when an element is referred to as being "directly on", "directly connected to" or "directly coupled with" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, wiring lines, layers and/or sections should not be limited by these terms. These terms are only used to distinguish one element, component, region, wiring line, layer or section from another region, layer or section. Thus, a first element, component, region, wiring line, layer or section discussed below could be termed a second element, component, region, wiring line, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

Embodiments of the present invention are described herein with reference to cross sectional illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes and relative sizes, thicknesses, and so forth, are not intended to illustrate the precise shape/size/thickness of a region and are not intended to limit the scope of the present invention.

Further, in this specification, writing data '0' in a memory cell may be defined as reset or data deletion.

The present invention will now be described more fully with reference to the accompanying drawings, in which preferred embodiments of the invention are shown.

Figure 2:
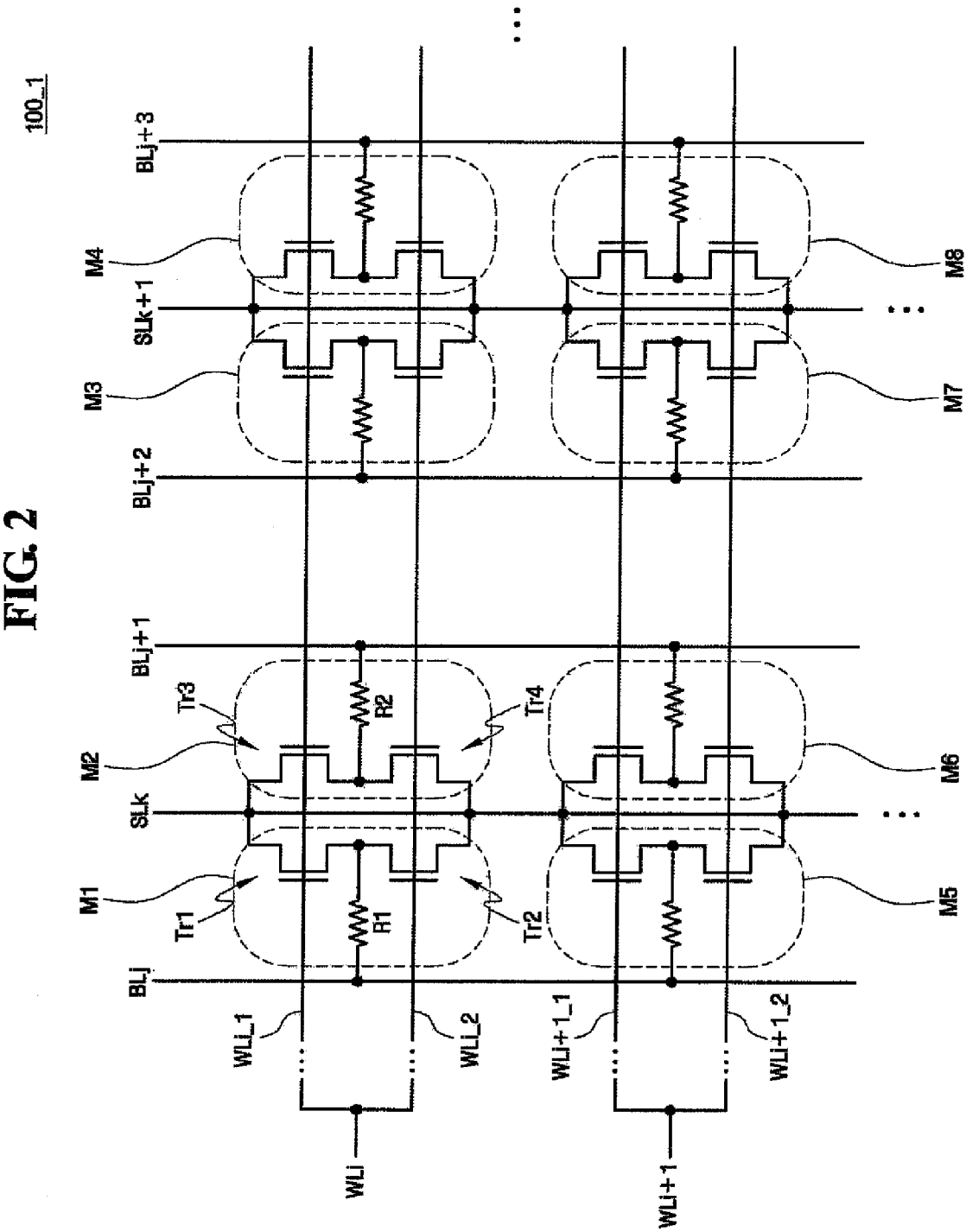
FIG. 2 is a circuit diagram further illustrating the semiconductor memory device according to the embodiment of the invention.

FIGS. 1 and 2 are a block diagram and a circuit diagram illustrating a semiconductor memory device according to an embodiment of the invention. In embodiments of the invention, for convenience of explanation, a case in which the number of memory banks is four is exemplified. However, the invention is not limited thereto. Also, for convenience of explanation, only some cells in one memory block are shown in FIG. 2.

Referring to FIG. 1, a semiconductor memory device 10 includes four memory banks 100_1, 100_2, 100_3, and 100_4, two row decoders 12_1 and 12_2, four row drivers 15_1, 15_2, 15_3, and 15_4, two column decoders 20_1 and 20_2, and four input/output circuits 30_1, 30_2, 30_3, and 30_4.

Each of the memory banks 100_1, 100_2, 100_3, and 100_4 includes a plurality of memory cells arranged in a matrix.

The row decoder 12_1 is provided to correspond to two memory banks 100_1 and 100_2 and the row decoder 12_2 is provided to correspond to two memory banks 100_3 and 100_4. The row decoders 12_1 and 12_2 designate row addresses in the memory banks 100_1, 100_2, 100_3, and 100_4. For example, the row decoder 12_1 can select row addresses in the memory banks 100_1 and 100_2.

The row drivers 15_1, 15_2, 15_3, and 15_4 adjust voltage levels of word lines corresponding to row addresses supplied from the row decoders 12_1 and 12_2.

The column decoder 20_1 is provided to correspond to two memory banks 100_1 and 100_3 and the column decoder 20_2 is provided to correspond to two memory banks 100_2 and 100_4. The column decoders 20_1 and 20_2 designate column addresses in the memory banks 100_1, 100_2, 100_3, and 100_4. For example, the column decoder 20_1 can select column addresses in the memory banks 100_1 and 100_3.

The input/output circuits 30_1, 30_2, 30_3, and 30_4 are disposed to correspond to the memory banks 100_1, 100_2, 100_3, and 100_4, respectively, and write data in the memory banks 100_1, 100_2, 100_3, and 100_4 or read data from the memory banks 100_1, 100_2, 100_3, and 100_4. Although not shown in FIG. 1, each of the input/output circuits 30_1, 30_2, 30_3, and 30_4 may include a writing circuit and/or a reading circuit.

Referring to FIG. 2, the semiconductor memory device according to the embodiment of the invention includes a plurality of word lines WLi and WLi+1, a plurality of bit lines BLj, BLj+1, BLj+2, and BLj+3, a plurality of common source lines SLk and SLk+1, and a plurality of memory cells M1 to M8. A pair of adjacent memory cells share one common source line. More specifically, first and second memory cells M1 and M2, or fifth and sixth memory cells M5 and M6 share the common source line SLk, and third and fourth memory cells M3 and M4 or seventh and eighth memory cells M7 and M8 share the common source line SLk+1.

The word line WLi includes first and second split word lines WLi_1 and WLi_2 and the word line WLi+1 includes first and second split word lines WLi+1_1 and WLi+1_2. The same electrical signal is applied to the first and second split word lines WLi_1 and WLi_2 and the same electrical signal is applied to the first and second split word lines WLi+1_1 and WLi+1_2.

One memory cell, for example, the first memory cell M1 includes a first access element Tr1, a second access element Tr2, and a first variable resistance element R1 coupled between the first and second access elements Tr1 and Tr2. Further, in the first memory cell M1, the first access element Tr1 is coupled with the first split word line WLi_1, the first variable resistance element R1, and the common source line SLk, and the second access element Tr2 is coupled with the second split word line WLi_2, the first variable resistance element R1, and the common source line SLk. The first and second access elements Tr1 and Tr2 may be MOS transistors.

Any one of at least two different types of data can be written in each of the memory cells M1 to M8 in accordance with a potential difference between a bit line BLj, BLj+1, BLj+2, or BLj+3 and a common source lines SLk or SLk+1 corresponding to each of the memory cells. For example, in the case of the first memory cell M1, when a high-level voltage is applied to the first bit line BLj and a low-level voltage is applied to the common source line SLk, '1' may be written, and when a low-level voltage is applied to the first bit line BLj and a high-level voltage is applied to the common source line SLk, '0' (or reset) may be written. That is, '0' or '1' is written in accordance with the direction of current flowing through the first variable resistance element R1. When '0' or '1' is written, current flows through the first variable resistance element R1. At this time, the first and second access elements Tr1 and Tr2 are enabled and thus a path through which the current flows is sufficiently ensured. Therefore, data can be exactly written.

Further, since one pair of adjacent memory cells, for example, the first and second memory cells M1 and M2 share the common source line SLk, the cell density of the semiconductor memory device is improved.

Hereinafter, the structure of the above-mentioned semiconductor memory device will be described in some additional detail.

Figure 3A:
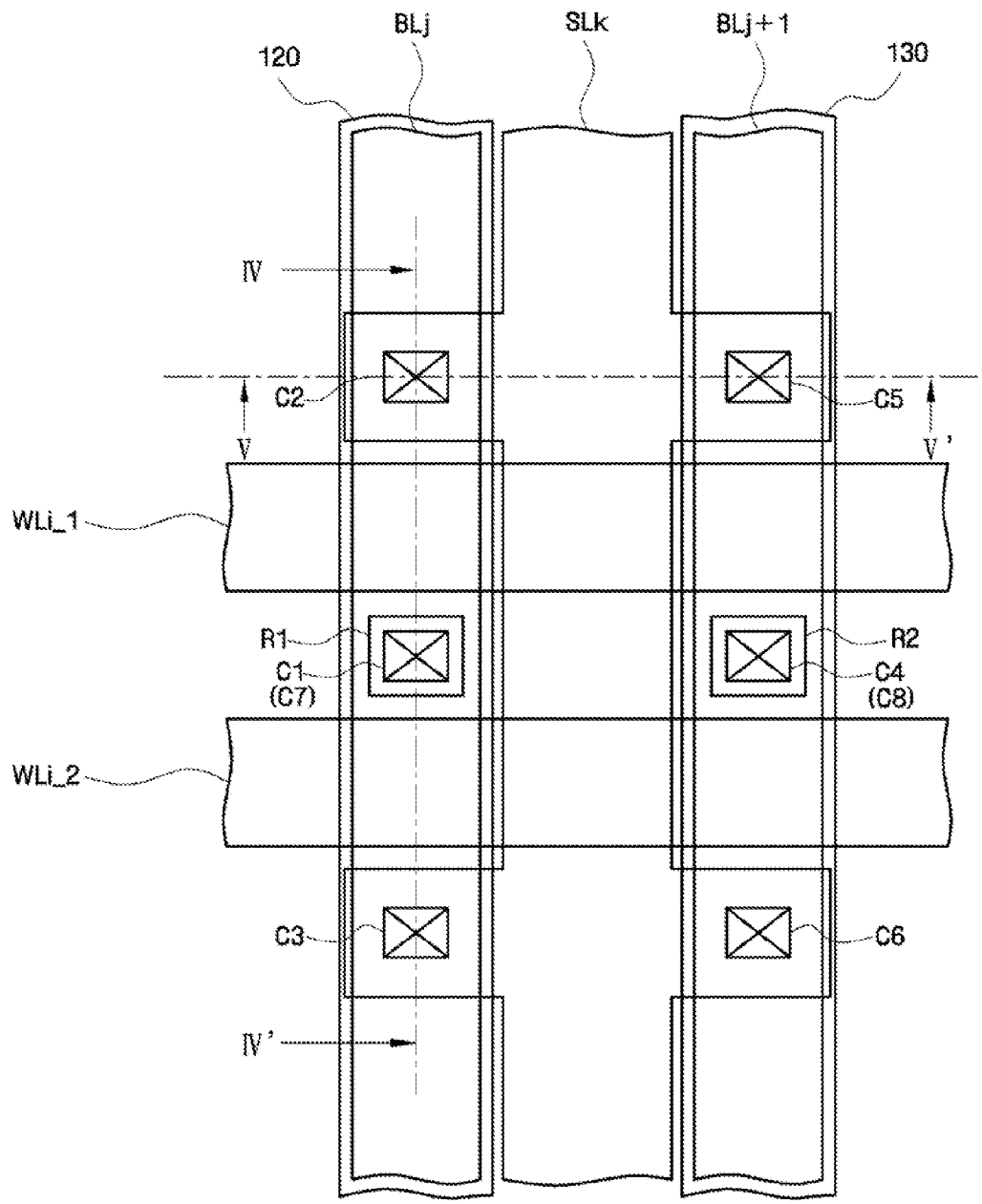
FIG. 3A is a diagram illustrating the layout of a semiconductor memory device according to another embodiment of the invention.
Figure 4:
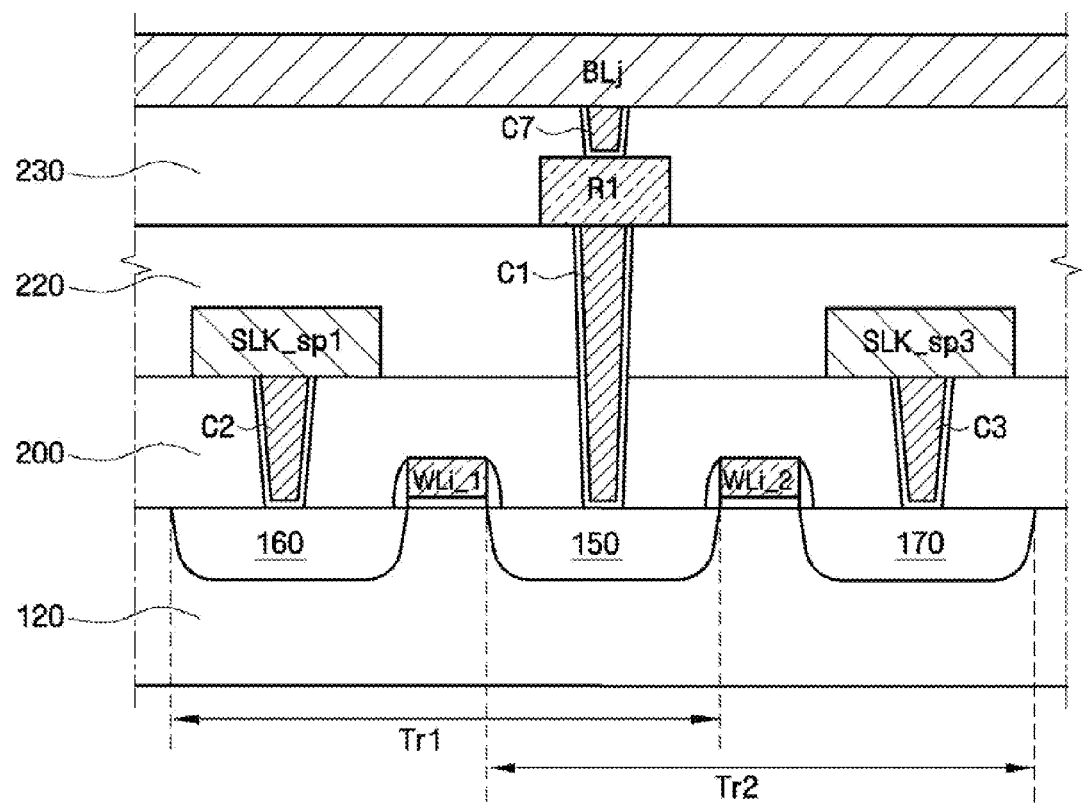
FIG. 4 is a cross-sectional view of the semiconductor memory device shown in FIG. 3A taken along a line IV-IV'.
Figure 5:
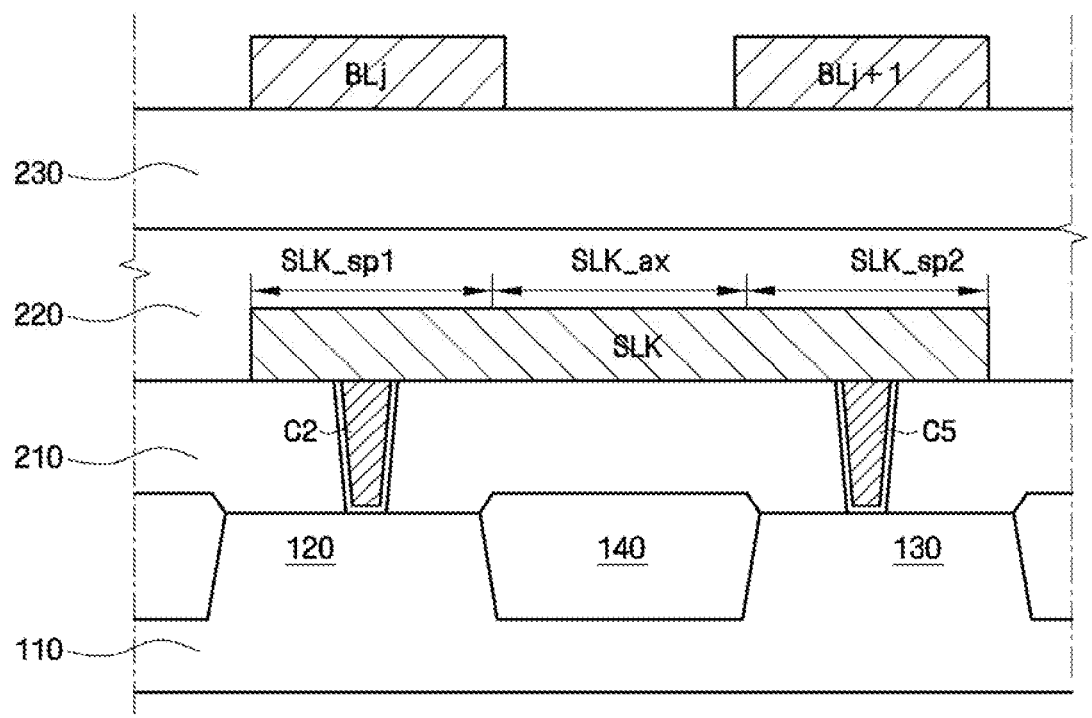
FIG. 5 is a cross-sectional view of the semiconductor memory device shown in FIG. 3A taken along a line VI-VI'.
Figure 6:
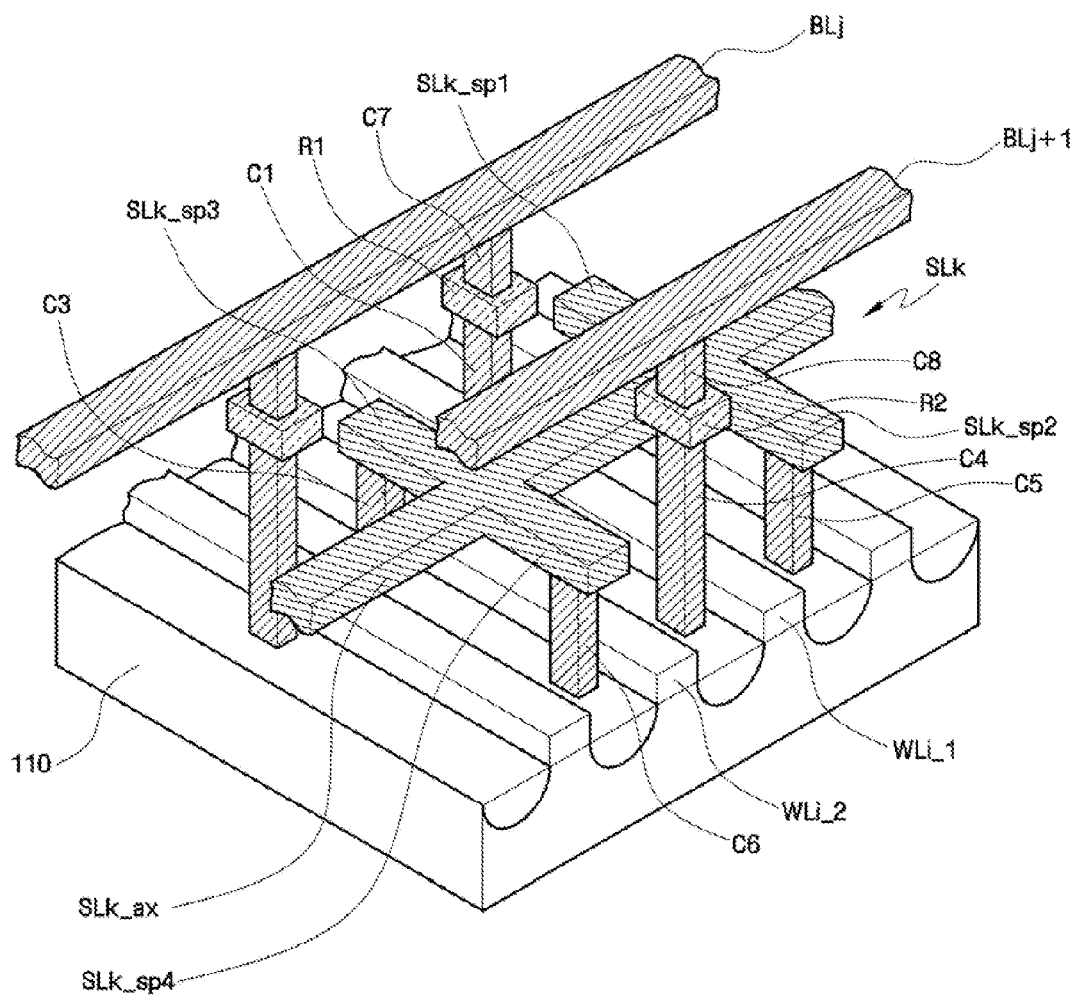
FIG. 6 is a perspective view illustrating the semiconductor memory device according to another embodiment of the invention.

The semiconductor memory device according to the embodiment of the invention will now be described with reference to FIGS. 3A to 6. FIG. 3A is a diagram illustrating the layout of a semiconductor memory device according to another embodiment of the invention. FIG. 3B is a diagram illustrating the layout of the common source line SLk shown in FIG. 3A. FIG. 4 is a cross-sectional view of the semiconductor memory device shown in FIG. 3A taken along a line IV-IV'. FIG. 5 is a cross-sectional view of the semiconductor memory device shown in FIG. 3A taken along a line V-V', and FIG. 6 is a perspective view illustrating the semiconductor memory device according to another embodiment of the invention. For convenience of explanation, only a portion of the semiconductor memory device corresponding to the first and second memory cells shown in FIG. 2 is shown in FIGS. 3A to 6.

A semiconductor memory device 11 according to another embodiment of the invention will be described briefly with reference to FIGS. 3A, 3B, and 6.

The semiconductor memory device 11 includes first and second split word lines WLi_1 and WLi_2, first and second bit lines BLj and BLj+1 formed to intersect the first and second split word lines WLi_1 and WLi_2, and a common source line SLk formed between the first and second bit lines BLj and BLj+1.

The common source line SLk has a fishbone antenna-like shape and includes an axis source line SLk_ax formed to intersect the first and second split word lines WLi_1 and WLi_2 and spine source lines SLk_sp1 to SLk_sp4 formed to protrude from the axis source line SLk_ax.

Further, the semiconductor memory device 11 includes first and second variable resistance elements R1 and R2 which are formed between the first and second split word lines WLi_1 and WLi_2 so as to be disposed on the opposite side of each other in respect to the axis source line SLk_ax. Furthermore, among the spine source lines SLk_sp1 to SLk_sp4, the first and second spine source lines SLk_sp1 and SLk_sp2 are formed on the opposite side of the first and second variable resistance elements R1 and R2 in respect to the first split word line WLi_1 so as to protrude from the axis source line SLk_ax in opposite directions. The third and fourth spine source lines SLk_sp3 and SLk_sp4 are formed on the opposite side of the first and second variable resistance elements R1 and R2 in respect to the second split word line WLi_2 so as to protrude from the axis source line SLk_ax in opposite directions.

Also, the semiconductor memory device 11 includes first to sixth contacts C1 to C6. The first contact C1 is formed between the first and second split word lines WLi_1 and WLi_2 and couples a first active area 120 with the first variable resistance element R1. The second contact C2 couples the first active area 120 with the first spine source line SLk_sp1. The third contact C3 couples the first active area 120 with the third spine source line SLk_sp3. The fourth contact C4 couples a second active area 130 with the second variable resistance element R2. The fifth contact C5 couples the second active area 130 with the second spine source line SLk_sp2. The sixth contact C6 couples the second active area 130 with the fourth spine source line SLk_sp4.

The first to third contacts C1, C2, and C3 are aligned in a direction in which the first active area 120 extends. Further, the fourth to sixth contacts C4, C5, and C6 are aligned in a direction in which the second active area 130 extends. Therefore, the widths of the first and second active areas 120 and 130 can be reduced. Furthermore, since two adjacent memory cells share the common source line SLk, the memory cell density can be improved. The semiconductor memory device 11 according to this embodiment of the invention will be described below in some additional detail with reference to FIGS. 3A to 6.

Referring to FIGS. 3A to 6, an element separating area 140 is formed in a conductive semiconductor substrate (for example, a P-type semiconductor substrate) 110, thereby defining the first and second active areas 120 and 130. That is, the first and second active areas 120 and 130 are formed in the semiconductor substrate 110 to extend in a first direction with the element separating area 140. The semiconductor substrate 110 may be a silicon substrate, a SOI (Silicon On Insulator) substrate, a GaAs substrate, a SiGe substrate, a ceramic substrate, a quartz substrate, or a glass substrate for display. The element separating area 140 may be an STI (shallow trench isolation) structure or a FOX (field oxide) formed by using a LOCOS (local oxidation of silicon) method.

The first and second split word lines WLi_1 and WLi_2 are formed on the semiconductor substrate 110 in a second direction so as to intersect the first and second active areas 130 and 140. Underneath the first and second split word lines WLi_1 and WLi_2, a gate insulating film is formed. Spacers may be formed on the side walls of the first and second split word lines WLi_1 and WLi_2. A portion of the first split word line WLi_1 intersecting the first active area 120 becomes the gate electrode of the first access element Tr1, and a portion of the second split word line WLi_2 intersecting the first active area 120 becomes the gate electrode of the second access element Tr2.

A common junction area 150, a first junction area 160, and a second junction area 170 are formed in the first and second active areas 120 and 130 by performing an impurity ion injection process using the first and second split word lines WLi_1 and WL_2 having spacers formed thereon as a self-aligned ion injection mask. The common junction area 150 shown in FIG. 4 becomes the drain electrodes of the first and second access elements Tr1 and Tr2, the first junction area 160 becomes the source electrode of the first access element Tr1, and the second junction area 170 becomes the source electrode of the second access element Tr2. Therefore, the first junction area 160, the common junction area 150, and the first slit word line WLi_1 constitute the first access element Tr1, and the second junction area 170, the common junction area 150, and the second slit word line WLi_2 constitute the second access element Tr2.

On the semiconductor substrate 110, an interlayer dielectric film 210 having a plurality of contact holes exposing portions of the top surfaces of the first and second junction areas 160 and 170 is formed. The interlayer dielectric film 210 may be a FOX (flowable oxide) film, a TOSZ (tonen silazene) film, a USG (undoped silicate glass) film, a BSG (borosilicate glass) film, a PSG (phosphosilicate glass) film, a BPSG (borophosphosilicate glass) film, a PE-TEOS (plasma enhanced-tetra ethyl ortho silicate) film, a FSG (fluoride silicate glass) film, a HDP (high density plasma) film, etc. The interlayer dielectric film 210 may be formed by using a CVD-based method. Examples of the CVD-based method include ALD (atomic layer deposition), PEALD (plasma enhanced atomic layer deposition), MOCVD (metal organic chemical vapor deposition), PECVD (plasma enhanced chemical vapor deposition), etc.

In the plurality of contact holes, the second and third contacts C2 and C3 coupled with the first active area 120 and the fifth and sixth contacts C5 and C6 coupled with the second active area 130 are formed. More specifically, the first junction area 160 is coupled with the second contact C2 and the second junction area 170 is coupled with the third contact C3.

On the second, third, fifth, and sixth contacts C2, C3, C5, and C6 and the interlayer dielectric film 210, the common source line SLk is formed. The common source line SLk has a fishbone antenna shape and includes the axis source line SLk_ax formed to extend in the first direction between the first active area 120 and the second active area 130 and the spine source lines SLk_sp1 to SLk_sp4 formed to protrude from the axis source line SLk_ax.

More specifically, in order for the first and second memory cells M1 and M2 to share the common source line SLk, the axis source line SLk_ax is formed between the first memory cell M1 and the second memory cell M2. The first to fourth spine source lines SLk_sp1 to SLk_sp4 protrude from the axis source line SLk_ax and are coupled with the individual memory cells. That is, the first spine source line SLk_sp1 is coupled with the second contact C2 that is coupled with the first active area 120, and the second spine source line SLk_sp2 is coupled with the fifth contact C5 that is coupled with the second active area 130. Further, the third spine source line SLk_sp3 is coupled with the third contact C3 that is coupled with the first active area 120, and the fourth spine source line SLk_sp4 is coupled with the sixth contact C6 that is coupled with the second active area 130. The common source line SLk may be formed of, for example, aluminum or tungsten.

On the common source line SLk, a first inter-metal dielectric film 220 is formed. The first inter-metal dielectric film 220 may be a silicon oxide (SiOx) film, such as a FOX (flowable oxide) film, a TOSZ (tonen silazene) film, a USG (undoped silicate glass) film, a BSG (borosilicate glass) film, a PSG (phosphosilicate glass) film, a BPSG (borophosphosilicate glass) film, a PE-TEOS (plasma enhanced-tetra ethyl ortho silicate) film, a FSG (fluoride silicate glass) film, or a HDP (high density plasma) film.

Meanwhile, a plurality of contact holes are formed in the interlayer dielectric film 210 and the first inter-metal dielectric film 220 and the first contact C1 and the fourth contact C4 are formed in the plurality of contract holes. More specifically, the first contact C1 is coupled with the common junction area 150. On the first inter-metal dielectric film 220, the first variable resistance element R1 is formed to be coupled with the first contact C1 and the second variable resistance element R2 is formed to be coupled with the fourth contact C4. The first to third contacts C1, C2, and C3 are aligned in the first direction and each are coupled with the first active area 120. Further, the fourth to sixth contacts C4, C5, and C6 are aligned in the first direction and each are coupled with the second active area 130. Since the first to third contacts C1, C2, and C3 are aligned and the fourth to sixth contracts C4, C5, and C6 are aligned, the widths of the first and second active areas 120 and 130 can be minimized. That is, the cell density can be improved. Each of the first and second variable resistance elements R1 and R2 may be an element whose resistance value varies according to the direction of the current of the corresponding variable resistance element and may contain, for example, NiO (nickel-oxide).

On the first and second variable resistance elements R1 and R2, a second inter-metal dielectric film having a plurality of contact holes exposing portions of the first and second variable resistance elements R1 and R2 is formed. A seventh contact C7 and an eighth contact C8 are formed in the contact holes.

On the seventh contact C7, the eighth contact C8, and the second inter-metal dielectric film 230, a first bit line BLj and a second bit line BLj+1 are formed. The first bit line BLj and the second bit line BLj+1 may be formed of, for example, aluminum or tungsten.

According to the semiconductor memory device having the above-mentioned structure, since adjacent memory cells share one common source line SLk, the memory cell density can be improved. In particular, since the first to third contacts C1, C2, and C3 are aligned and the fourth to sixth contacts C4, C5, and C6 are aligned as described above, the cell density can be improved.

Figure 7:
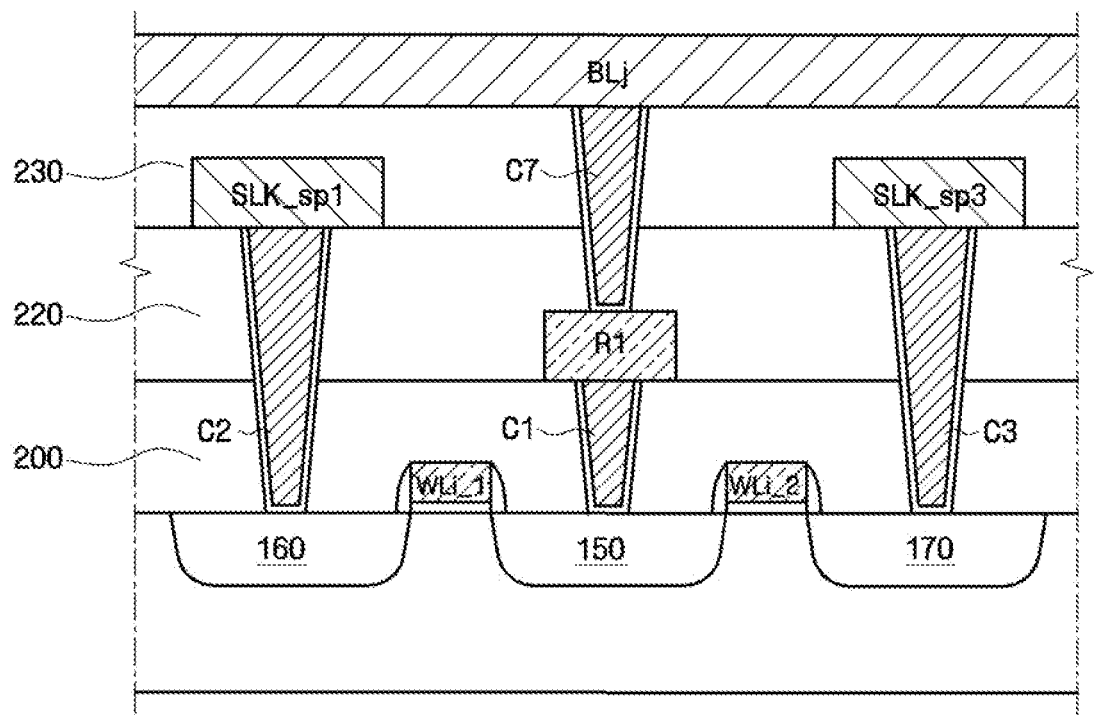
FIG. 7 is a cross-sectional view of a semiconductor memory device according to still another embodiment.

FIG. 7 is a cross-sectional view of a semiconductor memory device according to still another embodiment. Components of FIG. 7 substantially same as those shown in FIG. 4 are denoted by the same reference symbols and a description thereof will be omitted.

Referring to FIG. 7, a semiconductor memory device 12 according to still another embodiment of the invention is different from the previous embodiments in that the arrangement level of common source lines SLk can be more than that of variable resistance elements.

Figure 8:
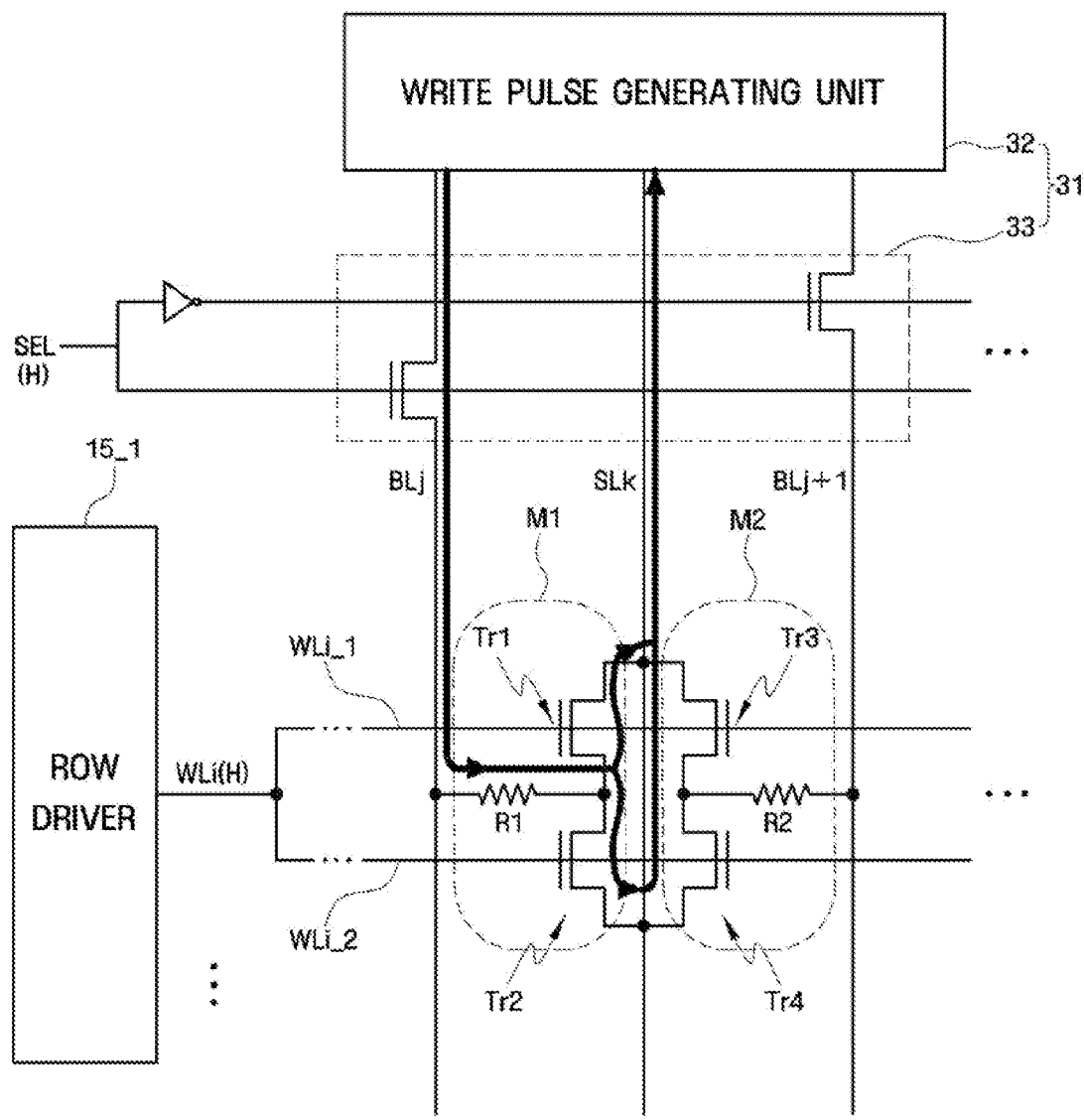
FIG. 8 is a circuit diagram for explaining the operation of the semiconductor memory devices according to the embodiments of the invention.

The operation of the semiconductor memory devices according to the embodiments will now be described in detail with reference to FIG. 8. FIG. 8 is a circuit diagram for explaining the operation of the semiconductor memory devices according to the embodiments of the invention. Components of FIG. 8 substantially the same as those shown in FIG. 2 are denoted by the same reference symbols and a description thereof will be omitted. First, it is assumed that, when a high-level voltage is applied to the bit line corresponding to a selected memory cell and a low-level voltage is applied to the source line corresponding to the selected memory cell, data '1' is written in the selected memory cell. Alternatively, when a high-level voltage is applied to the bit line corresponding to a selected memory cell and a low-level voltage is applied to the source line corresponding to the selected memory cell, data '0' may be written in the selected memory cell.

Referring to FIG. 8, the semiconductor memory device 10 includes a plurality of memory cells M1 and M2, a writing circuit 31, and the row driver 15_1. The plurality of memory cells M1 and M2 may be a portion of one memory bank 100_1 shown in FIG. 1 and the writing circuit 31 may be a portion of the input/output circuit 30_1 shown in FIG. 1.

First, an operation of writing data '1' in the first memory cell M1 will be described.

When the first word line WLi is selected by the row driver 15_1, the high-level voltage is applied to the first and second split word lines WLi_1 and WLi_2. Therefore, the first and second access elements Tr1 and Tr2 of the first memory cell M1 are enabled and third and fourth access elements Tr3 and Tr4 of the second memory cell M2 are enabled.

The writing circuit 31 includes a write pulse generating unit 32 and a selecting unit 33. In order to write data '1' in the first memory cell M1, the writing circuit 31 applies the high-level voltage to a first bit line BLj and applies the low-level voltage to the common source line SLk. That is, current flows from the first bit line BLj to the common source line SLk through the first variable resistance element R1. At this time, the first access element Tr1 and the second access element Tr2 are enabled. Therefore, a path through which an amount of current enough to write data '1' can flow is formed.

At this time, since the first memory cell M1 and the second memory cell M2 share the common source line SLk, when the write pulse generating unit 32 applies the high-level voltage to the second bit line BLj+1, data '1' can be written in the second memory cell M2. That is, malfunction can occur. For this reason, the selecting unit 33 separately controls the first memory cell M1 and the second memory cell M2. That is, the selecting unit 33 selects the first bit line BLj or the second bit line BLj+1 in response to a selection signal SEL. For example, when the selection signal SEL is at a high level H, the selecting unit 33 selects only the first bit line BLj and supplies the high-level voltage supplied from the write pulse generating unit 32 to the first bit line BLj.

In contrast, when the high-level voltage is applied to the common source line SLk and the low-level voltage is applied to the first bit line BLj, data '0' can be written in the first memory cell M1.

An operation of reading data from the first memory cell M1 will now be described. For example, a read pulse voltage is applied to the first bit line BLj and current flowing to the common source line SLk through the first variable resistance element R1 is measured, thereby reading data. However, the invention is not limited thereto.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

According to the above-mentioned semiconductor memory devices, one or more effects are obtained as follows. The memory cell density is improved. Further, since a path enough to flow current is ensured by using two transistors for each memory cell, it is possible to exactly write data. Therefore, it is possible to reduce the size of the semiconductor memory device and to improve reliability in the operation.

What is claimed is:

1. A semiconductor memory device comprising:
   first and second active areas extending in a first direction on a semiconductor substrate;
   first and second split word lines extending in a second direction on the semiconductor substrate;
   a common source line extending between the first and second active areas in the first direction and coupled to the first and second active areas;
   a first variable resistance element formed on the first active area between the first and second split word lines;
   a second variable resistance element formed on the second active area between the first and second split word lines;
   first and second bit lines extending in the first direction, and respectively coupled to the first and second variable resistance elements,
   a first contact coupling the first active area to the first variable resistance element;
   a second contact formed on the opposite side of the first contact with respect to the first split word line and coupling the first active area to the common source line;
   a third contact formed on the opposite side of the second contact with respect to the second split word line and coupling the first active area to the common source line;
   a fourth contact coupling the second active area to the second variable resistance element;
   a fifth contact formed on the opposite side of the fourth contact relative with respect to the first split word line and coupling the second active area to the common source line; and
   a sixth contact formed on the opposite side of the fourth contact with respect to the second split word line and coupling the second active area to the common source line.

2. The semiconductor memory device of claim 1, wherein the first, second and third contacts are aligned as a first group in the first direction, and the fourth, fifth and sixth contacts are aligned as a second group in the first direction.

3. The semiconductor memory device of claim 2, wherein:
   the common source line has a fishbone antenna-like shape and includes an axis source line extending in the first direction and a plurality of spine source lines protruding from the axis source line;
   wherein the spine source lines are respectively coupled to the second, third, fifth, and sixth contacts.

4. The semiconductor memory device of claim 1, wherein the first and second variable resistance elements are formed on the common source line.

5. The semiconductor memory device of claim 1, wherein the first and second bit lines are formed on the common source line.

6. The semiconductor memory device of claim 1, wherein any one of at least two different data values is written in each of the first and second variable resistance elements in accordance with a potential difference between the common source line and either the first bit line or the second bit line corresponding to the variable resistance elements.

7. The semiconductor memory device of claim 6, further comprising:
   a writing circuit selecting between the first variable resistance element or the second variable resistance element in response to a selection signal and writing the data in the selected variable resistance element.

8. The semiconductor memory device of claim 7, wherein the writing circuit comprises a selecting unit selecting the first bit line or the second bit line in response to the selection signal.

9. A semiconductor memory device comprising:
   first and second split word lines formed on a semiconductor substrate;
   a common source line having a fishbone antenna-like shape and including an axis source line intersecting the first and second split word lines and a plurality of spine source lines protruding from the axis source line; and
   first and second bit lines intersecting the first and second split word lines.

10. The semiconductor memory device of claim 9, further comprising:
    first and second variable resistance elements formed between the first and second split word lines, such that the first variable resistance element is disposed on an opposite side of the second variable resistance element with respect to the axis source line.

11. The semiconductor memory device of claim 10, wherein:
   first and second spine source lines from the plurality of spine source lines formed on the opposite side of the first and second variable resistance elements with respect to the first split word line and protruding from the axis source line in opposite directions; and
   third and forth spine source lines formed on the opposite side of the first and second variable resistance elements with respect to the second split word line and protruding from the axis source line in opposite direction.

12. The semiconductor memory device of claim 11, further comprising:
   first and second active areas extending to intersect the first and second split word lines;
   a first contact coupling the first active area to the first variable resistance element;
   a second contact coupling the first active area to the first spine source line;
   a third contact coupling the first active area to the third spine source line;
   a fourth contact coupling the second active area to the second variable resistance element;
   a fifth contact coupling the second active area to the second spine source line; and
   a sixth contact coupling the second active area to the fourth spine source line.

13. The semiconductor memory device of claim 12, wherein the first, second and third contacts are aligned as a first group in the direction in which the first active area extends, and the fourth, fifth and sixth contacts are aligned as a second group in the direction in which the second active area extends.

14. The semiconductor memory device of claim 10, wherein the first and second variable resistance elements are formed on the common source line.

15. The semiconductor memory device of claim 9, wherein the first and second bit lines are formed on the common source line.

16. The semiconductor memory device of claim 10, wherein each of the first and second variable resistance elements contains nickel-oxide (NiO).

17. The semiconductor memory device of claim 10, wherein any one of at least two different data values is written in each of the first and second variable resistance elements in accordance with a potential difference between the common source line and either the first bit line or the second bit line corresponding to the variable resistance elements.

18. A semiconductor memory device comprising:
   first and second active areas extending in a first direction on a semiconductor substrate;
   first and second split word lines extending in a second direction on the semiconductor substrate;
   a common source line extending between the first and second active areas in the first direction and coupled to the first and second active areas;
   a first variable resistance element formed on the first active area between the first and second split word lines;
   a second variable resistance element formed on the second active area between the first and second split word lines; and
   first and second bit lines extending in the first direction, and respectively coupled to the first and second variable resistance elements,
   wherein each of the first and second variable resistance elements contains nickel-oxide (NiO).

* * * * *